United States Patent
Xiong et al.

(10) Patent No.: US 10,186,809 B1
(45) Date of Patent: Jan. 22, 2019

(54) PRINTED CIRCUIT BOARD CONNECTOR WITH INTEGRATED EMI NOISE SUPPRESSION

(71) Applicant: Universal Lighting Technologies, Inc., Madison, AL (US)

(72) Inventors: Wei Xiong, Madison, AL (US); Donald Folker, Madison, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 0 days.

(21) Appl. No.: 15/962,303

(22) Filed: Apr. 25, 2018

Related U.S. Application Data (60) Provisional application No. 62/491,315, filed on Apr. 28, 2017.

(51) Int. Cl.
| | |
|---|---|
| *H01R 12/00* | (2006.01) |
| *H01R 13/6581* | (2011.01) |
| *H05K 1/02* | (2006.01) |
| *H01R 12/70* | (2011.01) |
| *H01R 12/57* | (2011.01) |
| *H01R 12/58* | (2011.01) |
| *H01R 12/71* | (2011.01) |

(52) U.S. Cl.
CPC ......... *H01R 13/6581* (2013.01); *H01R 12/57* (2013.01); *H01R 12/58* (2013.01); *H01R 12/7088* (2013.01); *H01R 12/716* (2013.01); *H05K 1/0233* (2013.01)

(58) Field of Classification Search
CPC .... H01R 13/6594; H01R 12/57; H01R 12/58; H01R 12/7088; H01R 12/716; H01R 13/6581; H05K 1/023; H05K 1/0233

USPC ..................... 439/55, 78, 620.018
See application file for complete search history.

(56) References Cited

U.S. PATENT DOCUMENTS

| | | | |
|---|---|---|---|
| 5,461,351 A | 10/1995 | Shusterman | |
| 6,125,044 A | 9/2000 | Cherniski et al. | |
| 6,276,943 B1 | 8/2001 | Boutros et al. | |
| 6,848,943 B2 | 2/2005 | Machado et al. | |
| 6,867,362 B2 | 3/2005 | Cherniski et al. | |
| 7,841,902 B2 * | 11/2010 | Chow | H01R 13/6633 439/620.15 |
| 8,152,567 B2 * | 4/2012 | Wu | H01R 13/6633 439/620.06 |

* cited by examiner

*Primary Examiner* — Khiem Nguyen
(74) *Attorney, Agent, or Firm* — Patterson Intellectual Property Law, P.C; Gary L. Montle; Alex H. Huffstutter (57) ABSTRACT

A connector assembly suppresses electromagnetic interference (EMI) generated by electronic circuitry on a printed circuit board (PCB). The connector assembly includes a plurality of conductive through-holes on the PCB, a connector, and a magnetic collar. The plurality of conductive through-holes are electrically connected to the electronic circuitry on the PCB. The connector has a plurality of terminal pins extending from a connector surface. The plurality of terminal pins and conductive through-holes may be aligned. The terminal pins are positioned through the conductive through-holes to electrically connect the terminals pins to the electronic circuitry. The magnetic collar surrounds the connector. The magnetic collar may also abut the PCB. The magnetic collar suppresses EMI on voltages propagating through the connector.

20 Claims, 13 Drawing Sheets

PRINTED CIRCUIT BOARD CONNECTOR WITH INTEGRATED EMI NOISE SUPPRESSION

CROSS-REFERENCES TO RELATED APPLICATIONS

This application claims benefit of the following patent application which is hereby incorporated by reference: U.S. Provisional Patent Application No. 62/491,315 filed Apr. 28, 2017 entitled "Printed Circuit Board Connector with Integrated EMI Noise Suppression."

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

FIELD OF THE INVENTION

The present disclosure generally relates to electromagnetic (EMI) suppression. More particularly, the present disclosure relates to EMI suppression at a connector of a printed circuit board (PCB).

BACKGROUND OF THE INVENTION

Figure 1:
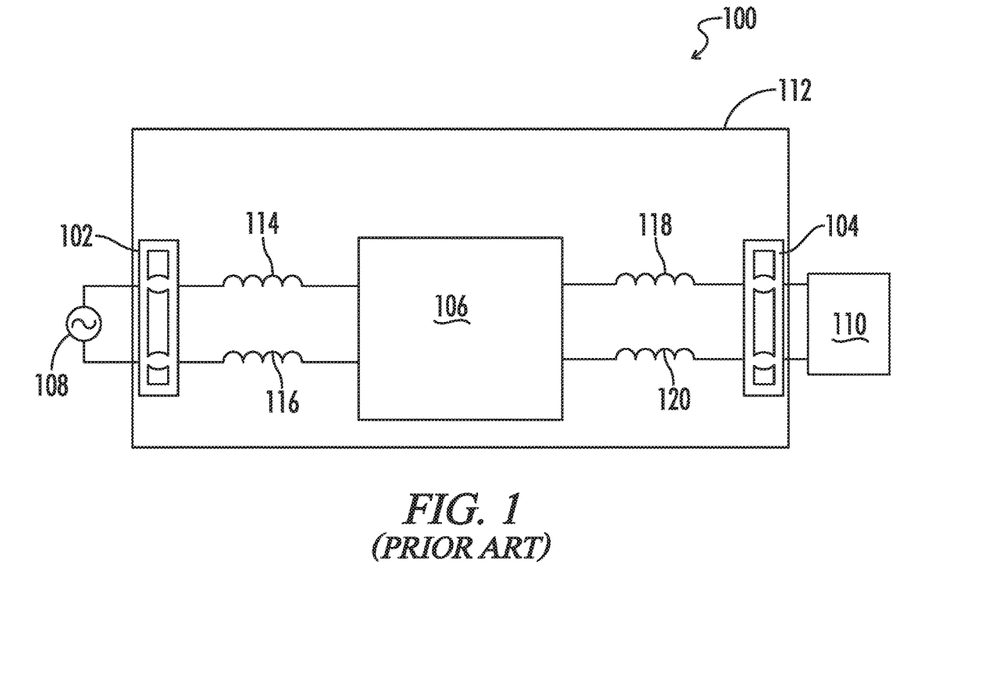
FIG. 1 illustrates a traditional power converter system with radio frequency (RF) beads for RF noise suppression.

Power converter systems (e.g., AC-DC converters or AC-AC converters) are regulated by the Federal Communications Commission (FCC) with regard to radio emission produced. The FCC standards are typically met by using radio frequency (RF) beads to suppress EMI as shown in FIG. 1, which illustrates a conventional power converter system 100. The power converter system 100 includes one or more of an input connector 102, an output connector 104, and a power processing module 106. The input connector 102 is coupled to an external alternating current voltage source 108. The output connector is coupled to an external load 110. The external load 110 receives a direct current (DC) voltage from the power processing module 106. The input connector 102, the output connector 104, and the power processing module 106 are positioned on a printed circuit board (PCB) 112.

The power converter system 100 includes a first RF bead 114 and a second RF bead 116. Each of the first and second RF beads 114, 116 is coupled onto a respective lead line between the input connector 102 and the power processing module 106. Each of the first and second RF beads 114, 116 is located at the immediate input of the power processing module 106. The power converter system 100 further includes a third RF bead 118 and a fourth RF bead 120. Each of the third and fourth RF beads 118, 120 is coupled to a respective lead line between the power processing module 106 and the output connector 104. The third and fourth RF beads 118, 120 are positioned at or near the immediate output of the power processing module 106. The first, second, third, and fourth RF beads 114, 116, 118, 120 are used to suppress emission of high frequency noise (e.g., in a range of 30 MHz-300 MHz) out of the power converter system 100. RF beads 114, 116, 118, 120 enable the power converter system 100 to pass FCC RF emission tests.

RF beads are typically very costly, require excessive area on the PCB, dissipate power, and negatively affect system efficiency. Other known RF suppression devices (e.g., drum core inductors, ferrite toroids, and the like) have similar issues.

BRIEF SUMMARY OF THE INVENTION

A need exists for an EMI suppression assembly that eliminates the use of RF beads on PCBs. The EMI suppression assembly disclosed herein is more efficient, cost effective and better suited for assembly line construction than magnetic components such as drum cores, RF beads, ferrite toroids, or the like. The disclosed assembly integrates EMI noise suppression with the connector in order minimize the space devoted to RF beads on PCBs.

In one embodiment, a connector assembly is provided for suppressing electromagnetic interference (EMI) generated by electronic circuitry on a printed circuit board (PCB). The connector assembly includes a plurality of conductive through-holes, a connector, and a tube of magnetic material. The plurality of conductive through-holes form a hole pattern on the PCB. The conductive through-holes are electrically connected to the electronic circuitry on the PCB. The connector has a plurality of terminal pins, which extend from a connector surface. The terminal pins are configured to form a pin pattern. The pin pattern conforms to the hole pattern of the conductive through-holes on the PCB. The terminal pins are insertable into the conductive through-holes of the PCB to electrically connect the terminal pins to the electronic circuitry. The connector also has an outer perimeter. The tube of magnetic material surrounds the outer perimeter of the connector. The tube has a first end surface configured to abut a PCB surface of the PCB.

In certain embodiments, the connector includes a plurality of conductors attached thereto. The conductors are configured in electrical communication with the terminal pins. In some embodiments, the plurality of conductors are attached to a source of alternating current (AC) power. In other embodiments, the plurality of conductors are attached to a direct current (DC) load.

In certain embodiments, the tube of magnetic material is rectangular.

In certain embodiments, the tube of magnetic material includes an inner wall, an outer wall, the first end surface, and a second end surface. The first and second end surfaces define a tube height. The inner wall engages the outer perimeter of the connector. The inner wall has a first inner surface, a second inner surface, a third inner surface and a fourth inner surface. All of the inner surfaces are configured to engage the outer perimeter of the connector.

In certain embodiments, the connector includes a connector height. The tube height less than the connector height. In some embodiments, the tube height is less than 50% of the connector height.

Another embodiment disclosed herein is a connector assembly for suppressing electromagnetic interference (EMI) from electronic circuitry on a printed circuit board (PCB). The connector assembly includes a plurality of conductive through-holes, a connector, and a magnetic collar. The plurality of conductive through-holes are formed in the PCB. The conductive through-holes are electrically connected to the electronic circuitry on the PCB. The connector has a plurality of terminal pins, which extend perpendicularly from the connector. The terminal pins are configured to pass through and electrically engage with the plurality of conductive through-holes. The terminal pins are thereby electrically engaged with the electronic circuitry on the PCB. The magnetic collar is positionable around the connector. The magnetic collar has a first end positioned proximate to the PCB.

In certain embodiments, the magnetic collar is held in frictional engagement with the connector.

In certain embodiments, the magnetic collar includes a generally rectangular passageway extending from the first end to a second end.

In certain embodiments, the PCB includes a plurality of leg holes, and the magnetic collar includes a plurality of collar legs. The collar legs extend from the first end of the magnetic collar. The plurality of leg holes of the PCB are configured to receive the plurality of collar legs. The terminal pins align with the conductive through-holes when the connector is received through the magnetic collar.

Another embodiment disclosed herein is a method of suppressing electromagnetic interference (EMI) caused by electrical circuitry on a printed circuit board (PCB). The method includes the step of connecting the electronic circuitry to a plurality of conductive through-holes on the PCB. The method further includes the step of positioning a connector on the PCB. The connector has a plurality of terminal pins. The terminal pins of the connector are positioned through the plurality of conductive through-holes to electronically couple the terminal pins to the electronic circuitry of the PCB. The method further includes the step of positioning a magnetic collar around the connector to suppress EMI communicated from the electronic circuitry to the terminal pins.

In certain embodiments, the connector has a plurality of conductors connected to a source of alternating current (AC) power.

In certain embodiments, the connector has a plurality of conductors connected to a direct current (DC) load.

In certain embodiments, the method may include the further steps of connecting a plurality of conductors from the connector to a DC load. The method may further include the step of producing a DC voltage on the PCB to provide DC current to the DC load. The DC voltage includes EMI superimposed thereon. The method may further include the step of suppressing the EMI with the magnetic collar as the DC voltage passes through the magnetic collar.

In certain embodiments, the PCB is positioned inside a light emitting diode (LED) driver housing.

DETAILED DESCRIPTION OF THE INVENTION

In the following description, various dimensional and orientation words, such as height, width, length, longitudinal, horizontal, vertical, up, down, left, right, tall, low profile, and the like, may be used with respect to the illustrated drawings. Such words are used for ease of description with respect to the particular drawings and are not intended to limit the described embodiments to the orientations shown. It should be understood that the illustrated embodiments can be oriented at various angles and that the dimensional and orientation words should be considered relative to an implied base plane that would rotate with the embodiment to a revised selected orientation.

Reference will now be made in detail to embodiments of the present disclosure, one or more drawings of which are set forth herein. Each drawing is provided by way of explanation of the present disclosure and is not a limitation. It will be apparent to those skilled in the art that various modifications and variations can be made to the teachings of the present disclosure without departing from the scope of the disclosure. For instance, features illustrated or described as part of one embodiment can be used with another embodiment to yield a still further embodiment.

It is intended that the present disclosure covers such modifications and variations as come within the scope of the appended claims and their equivalents. Other objects, features, and aspects of the present disclosure are disclosed in the following detailed description. It is to be understood by one of ordinary skill in the art that the present discussion is a description of exemplary embodiments only and is not intended as limiting the broader aspects of the present disclosure.

A connector assembly 200 is illustrated in FIGS. 2-9. The connector assembly 200 is configured to suppress electromagnetic interference (EMI) generated by electronic circuitry 202 on a printed circuit board (PCB) 204.

Figure 2:
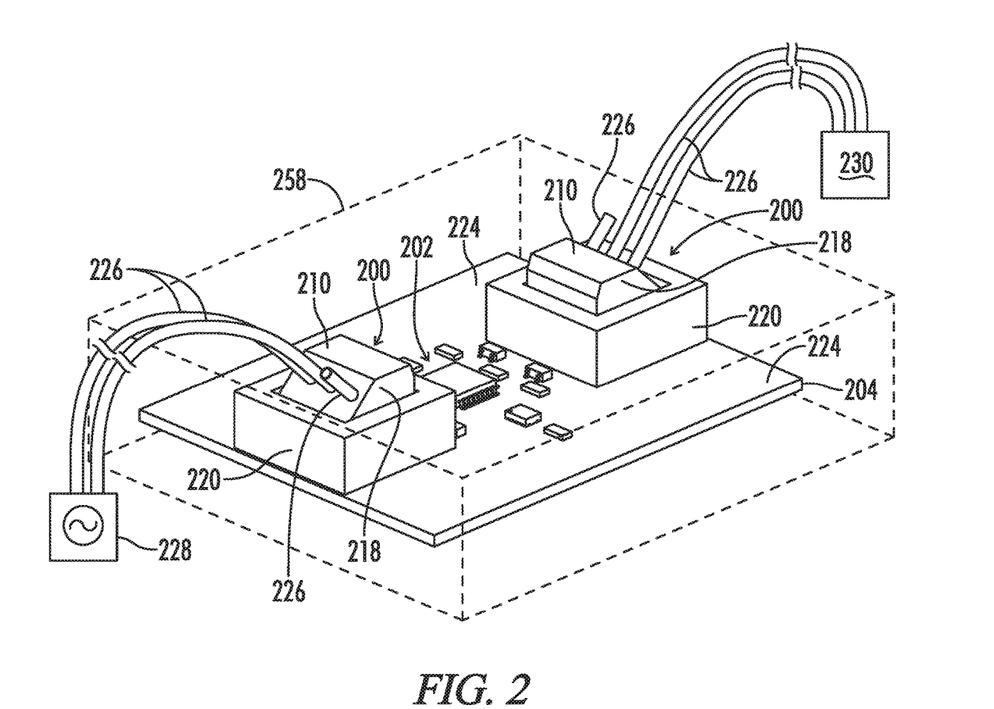
FIG. 2 illustrates a perspective view of a power converter system implementing first and second connector assemblies within a light emitter diode (LED) driver housing in accordance with the present disclosure.
Figure 3:
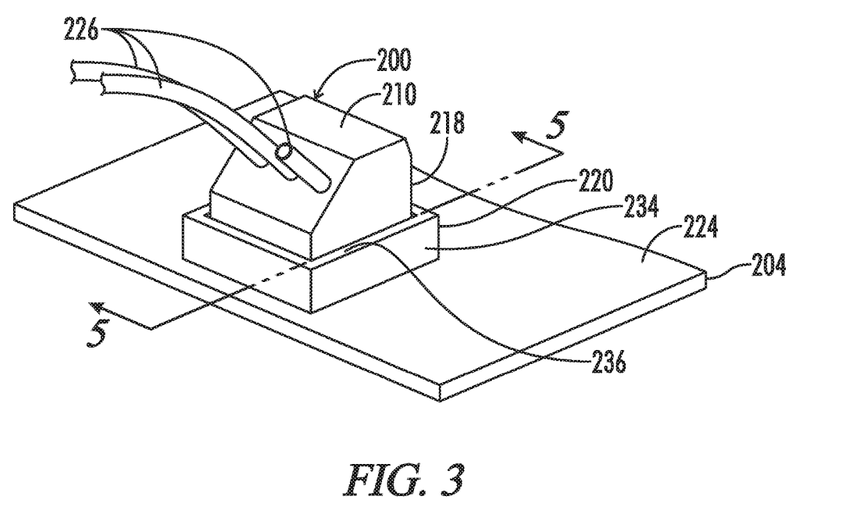
FIG. 3 illustrates a perspective view of a connector assembly with a low profile magnetic collar in accordance with the present disclosure.
Figure 4:
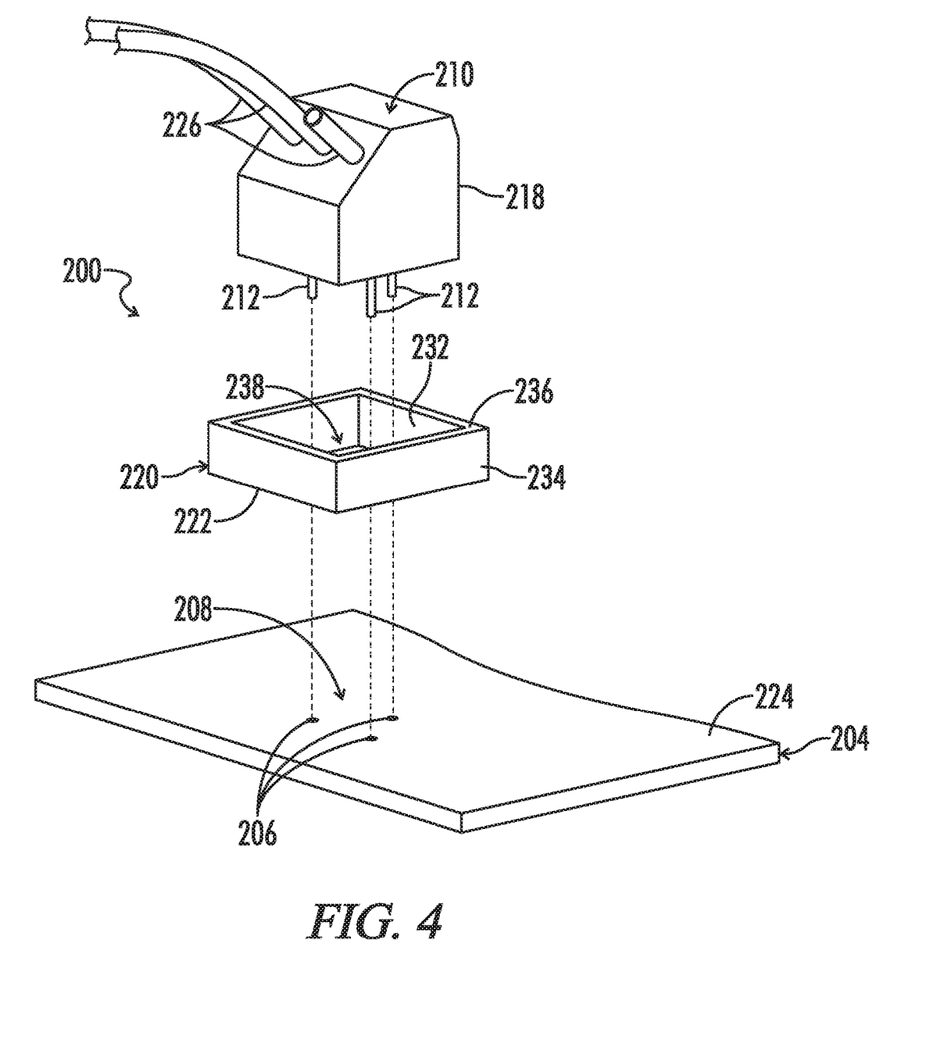
FIG. 4 illustrates an exploded perspective view of the connector assembly of FIG. 3.
Figure 7:
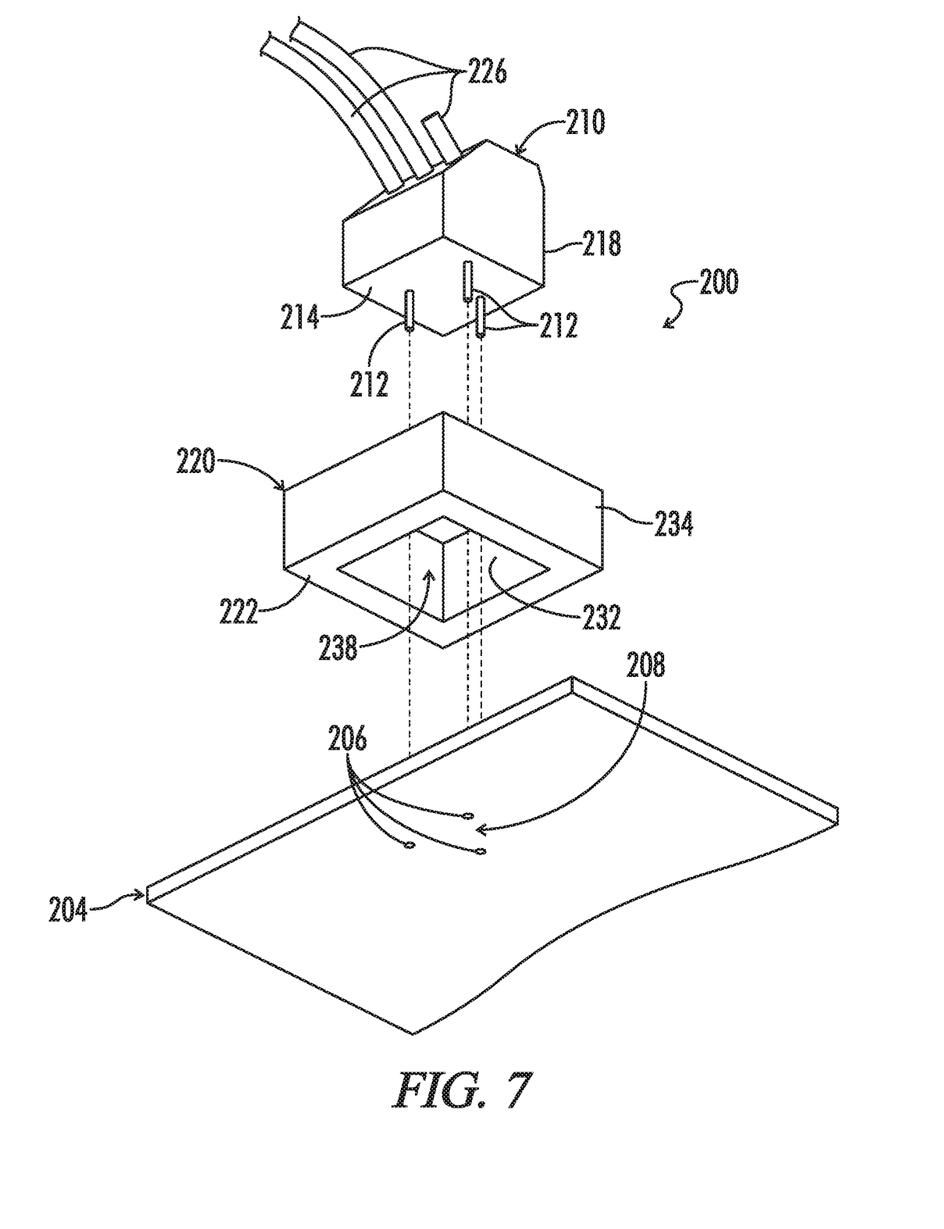
FIG. 7 illustrates an exploded perspective view of the connector assembly of FIG. 6.

As shown in FIGS. 4 and 7, the connector assembly includes a plurality of conductive through-holes 206 positioned through the PCB 204. The conductive through-holes 206 form a hole pattern 208 on the PCB 204. The conductive through-holes 206 are electrically connected to the electronic circuitry 202 (FIG. 2).

Figure 9:
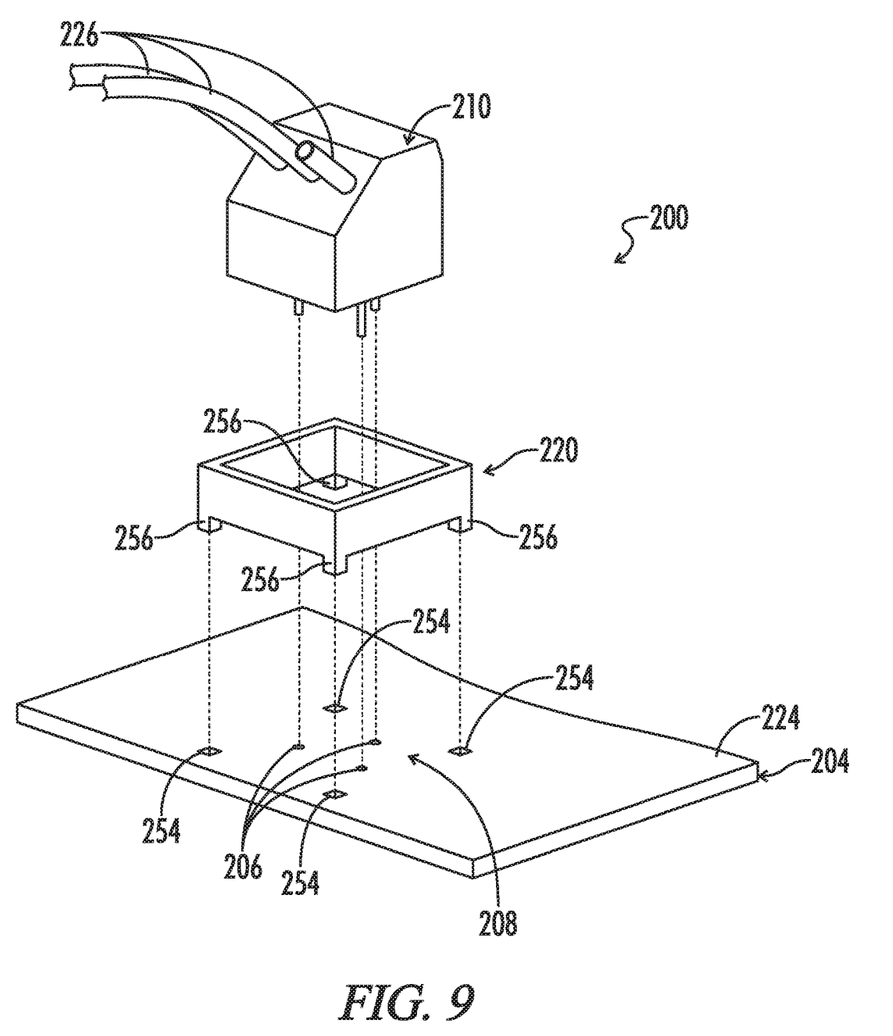
FIG. 9 illustrates an exploded perspective view of the connector assembly of FIG. 3 including collar legs aligned with PCB leg holes.
Figure 12:
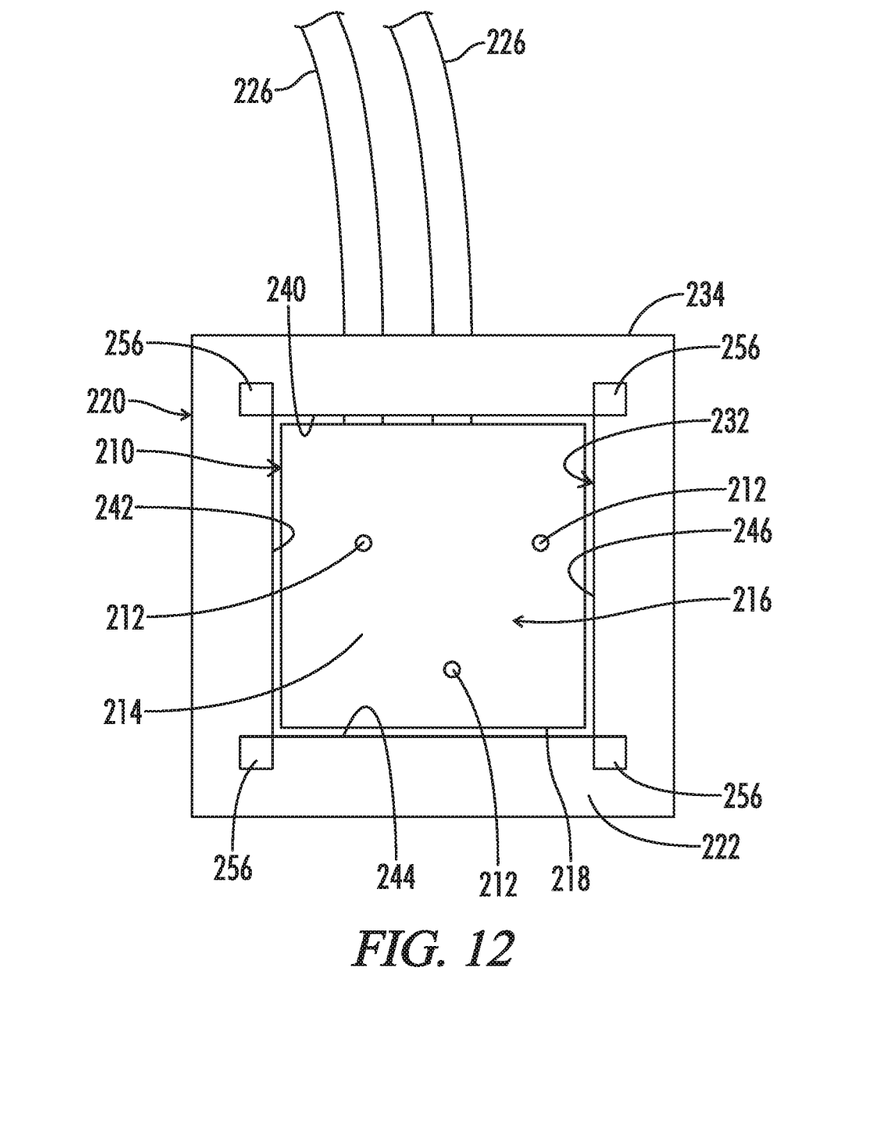
FIG. 12 illustrates a lower plan view of the connector in combination with the magnetic collar of FIG. 11 having collar legs in accordance with the present invention.

The connector assembly 200 further includes a connector 210. As shown in FIGS. 4, 7, and 9, the connector 210 has a plurality of terminal pins 212. The terminal pins 212 extend from a connector surface 214 of the connector 210. The terminal pins 212 are configured to form a pin pattern 216 (FIGS. 10 and 12) on the connector surface 214. The pin pattern 216 conforms to the hole pattern 208 on the PCB 204. The terminal pins 212 are configured to be inserted into the conductive through-holes 206. When the terminal pins 212 are inserted into the conductive through-holes 206 and secured therein (e.g., by soldering), the terminal pins 212 are electrically connected to the electronic circuitry 202. The connector 210 has an outer perimeter 218. In the illustrated embodiment, the outer perimeter is rectangular (e.g., square).

Figure 5:
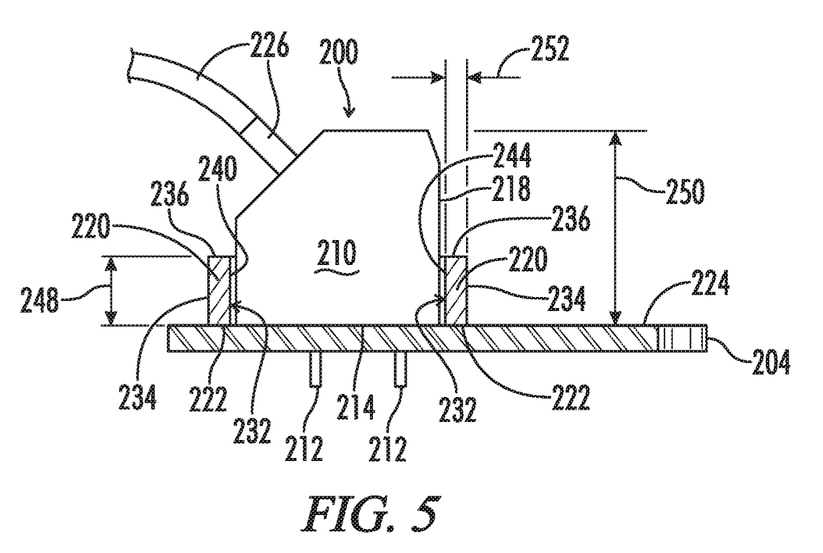
FIG. 5 illustrates a cross-sectional right side elevational view of the connector assembly of FIG. 3 taken along the line 5-5 of FIG. 3.
Figure 6:
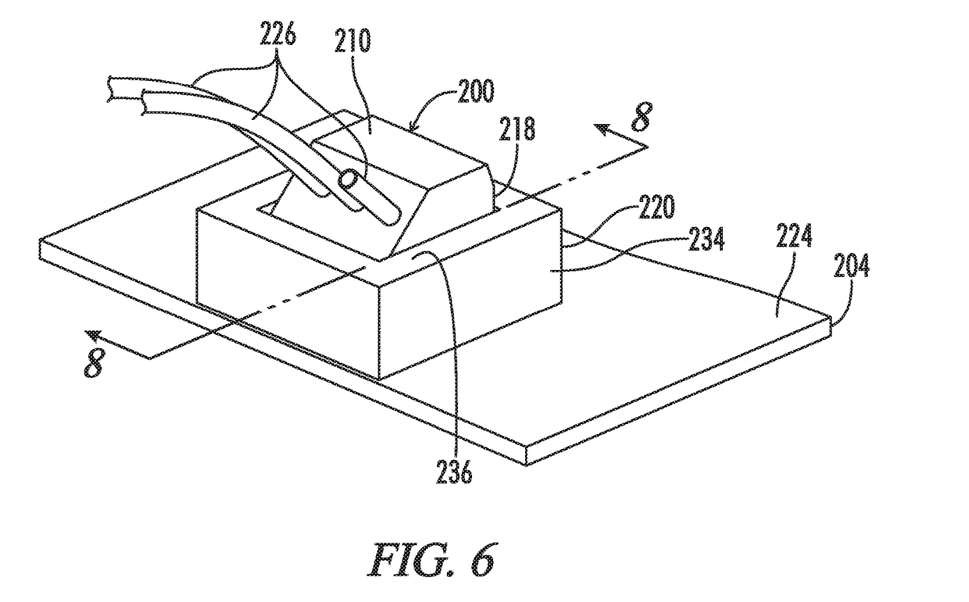
FIG. 6 illustrates a perspective view of a connector assembly with a high profile magnetic collar in accordance with the present disclosure.
Figure 8:
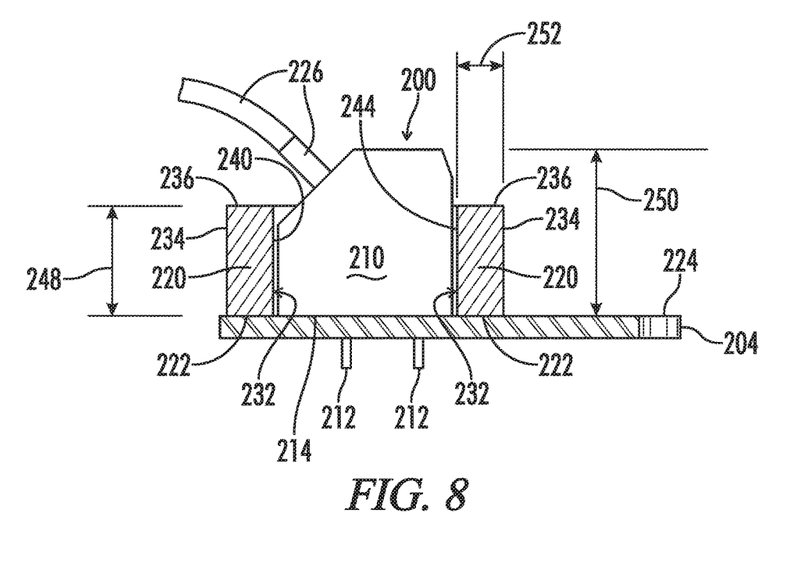
FIG. 8 illustrates a cross-sectional right side elevational view of the connector assembly of FIG. 6 taken along the line 8-8 of FIG. 6.

The connector assembly 200 further includes a magnetic collar 220. The magnetic collar 220 may also be referred to as a tube 220 of magnetic material. The magnetic collar 220 may be formed from ferrite or another suitable magnetic material. The magnetic collar 220 surrounds the outer perimeter 218 of the connector 210. As shown in FIGS. 5, 8, and 9, the magnetic collar 220 has a first end surface (or a first end) 222. The first end surface 222 of the magnetic collar 220 is configured to rest on a PCB surface 224. The PCB surface 224 may be an upper surface of the PCB 204.

The connector assembly 200 includes a plurality of conductors 226. The conductors 226 are attached so as to be in electrical communication with the terminal pins 212. As shown in FIG. 2, the conductors 226 of a first connector 210 are coupled to a source of alternating current (AC) 228 ("AC source 228"). As also shown in FIG. 2, the conductors 226 of a second connector 210 are coupled to a direct current (DC) load 230. In FIG. 2, only two of the three conductors 226 of each connector 210 are connected.

The respective magnetic collar 220 of each connector 210 is configured to function as an inductor to suppress EMI which passes through the magnetic collar 200 either to the AC source 228 or to the DC load 230. As shown in FIGS. 5 and 8, the magnetic collar 220 includes an inner wall 232, an outer wall 234, the first end surface 222, and a second end surface 236. The inner wall 232 is configured to engage the outer perimeter 218 of the connector 210. The inner wall 232 defines a collar cavity 238. The collar cavity 238 extends from the first end surface 222 to the second end surface 236. As shown in FIG. 9, the inner wall 232 includes a first inner surface 240, a second inner surface 242, a third inner surface 244, and a fourth inner surface 246. The inner surfaces 240, 242, 244, 246 surround the collar cavity 238, which is configured to surround the outer perimeter 218 of the connector 210.

Figure 13:
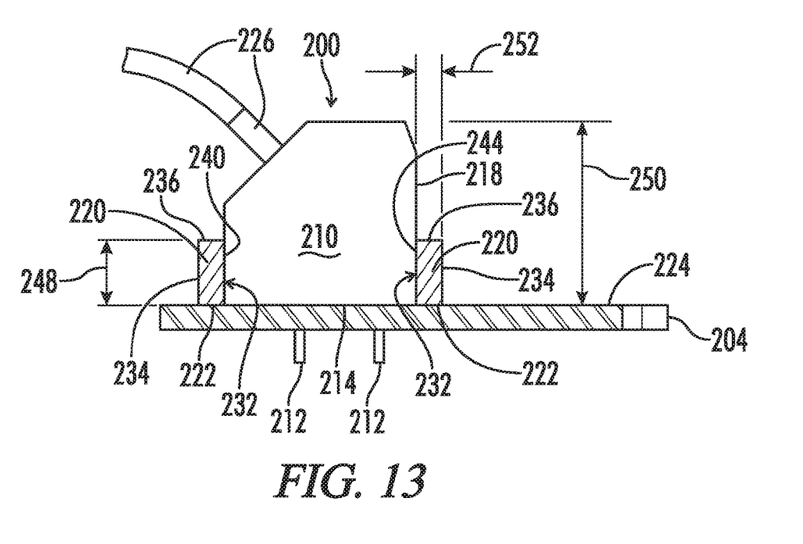
FIG. 13 illustrates the cross-sectional right side elevational view of the connector assembly of FIG. 5 with the magnetic collar held in frictional engagement with the connector.

As shown in FIGS. 5 and 8, the collar cavity 238 of the magnetic collar 220 is dimensioned larger than the outer perimeter 218 of the connector 210. The magnetic collar 220, as shown in FIGS. 5 and 8, is taped or glued to the connector 210. Alternatively, as shown in FIG. 13, the collar cavity 238 of the magnetic collar 220 is sized to fit snugly on the connector 210. The magnetic collar 220, as shown in FIG. 13, is held in fictional engagement with the connector 210.

As shown in FIGS. 4, 7, and 9, the magnetic collar 220 is square. In other embodiments (not shown), the magnetic collar 220 may be shaped differently (e.g., oblong rectangular, circular, oval, triangular, etc.) so as to match the shaped of the connector 210.

As shown in FIGS. 5 and 8, the first and second end surfaces 222, 236 define a collar height (or a tube height) 248. The connector 210 has a connector height 250. As illustrated, the collar height 248 is less than the connector height 250. For example, as shown in FIG. 8, the collar height 248 is less than 50% of the connector height 250. The inner wall 232 and the outer wall 234 define a collar thickness 252. The collar height 248 and the collar thickness 252 of the magnetic collar 220 determine the volume of ferrite material and affect the inductance of the magnetic collar 220. The collar height 248 and collar thickness 252 can be selected based on EMI suppression requirements. As observed by comparing FIGS. 5 and 8, the collar height 248 and the collar thickness 252 are adjustable in at least four ways: a tall and thick collar (as shown in FIG. 8), a tall and thin collar (not shown), a short and thick collar (not shown), and a short and thin collar (as shown in FIG. 5).

Figure 10:
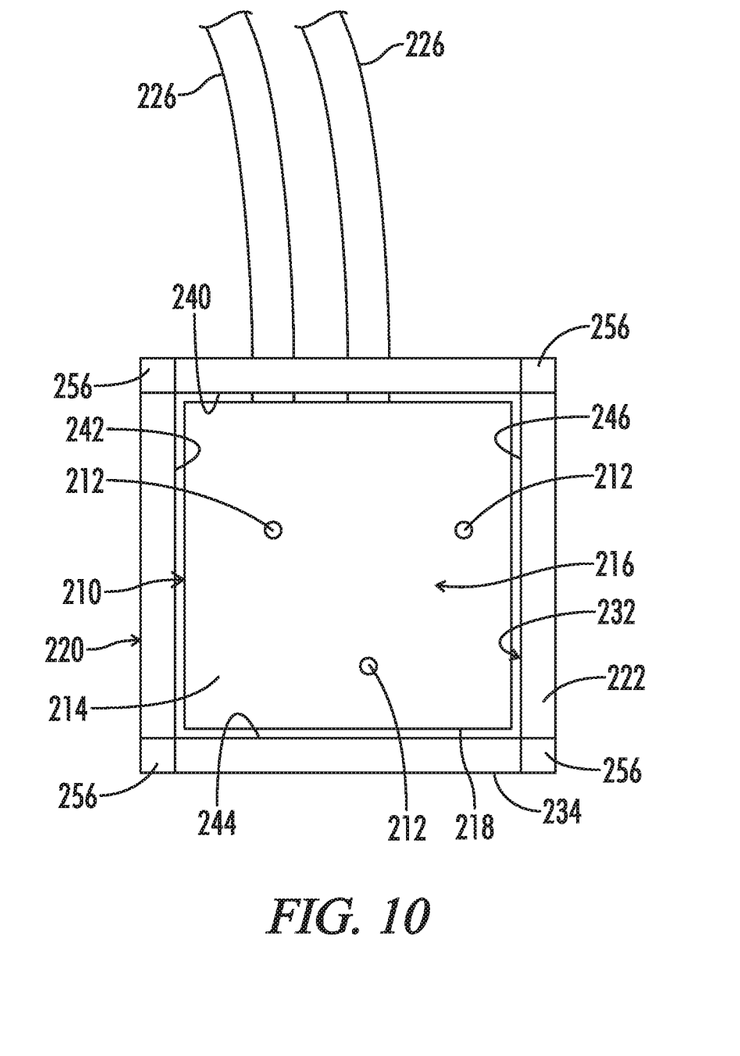
FIG. 10 illustrates a lower plan view of the connector in combination with the magnetic collar of FIG. 9 having collar legs in accordance with the present invention.
Figure 11:
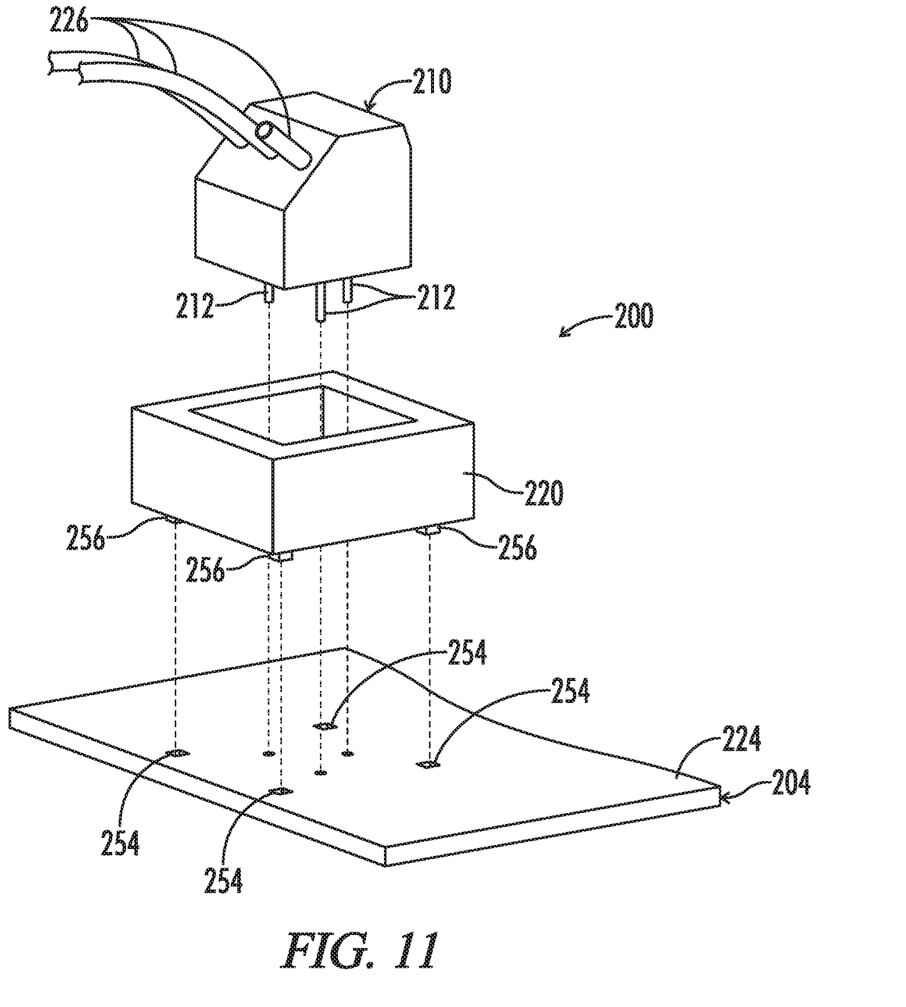
FIG. 11 illustrates an exploded perspective view of the connector assembly of FIG. 6 including collar legs aligned with PCB leg holes.

As shown in FIGS. 9 and 11, the PCB 204 includes a plurality of leg holes 254. The plurality of leg holes 254 extend at least partially through the PCB 204. As shown in FIGS. 9 and 10, the first end surface 222 of certain embodiments of the magnetic collar 220 include a plurality of collar legs 256. The plurality of collar legs 256 extend perpendicularly from the first end surface 222. The plurality of leg holes 254 are configured to receive the plurality of collar legs 256. When the magnetic collar 220 is received on the PCB 204, the terminal pins 212 of the connector 210 align with the conductive through-holes 206 when the connector 210 is received through the collar cavity 238 of the magnetic collar 220.

A method for suppressing EMI caused by the electronic circuitry 202 on the PCB 204 is provided. The method includes the step of connecting the electronic circuitry 202 to the plurality of conductive through-holes 206 on the PCB 204. The method further includes the step of positioning the connector 210 on the PCB 204. The method further includes positioning the magnetic collar 220 around the connector 210 to suppress EMI communicated from the electronic circuitry 202 to the terminal pins 212.

In certain embodiments, the method includes the step of connecting the plurality of conductors 226 from the connector to the DC load 230. In such embodiments, the method includes the step of producing a DC voltage (not shown) on the PCB 204 to provide DC current (not shown) to the DC load 230. The method includes the step of suppressing superimposed EMI with the magnetic collar 220 as the DC voltage passes through the magnetic collar 220.

In certain embodiments, the method includes the step of connecting the plurality of conductors 226 to the AC source 228 and suppressing EMI feedback similar to the above steps.

In certain embodiments, the PCB 204 and connector assembly 200 may be positioned in a light emitting diode (LED) housing 258 as shown in FIG. 2.

Thus, although there have been described particular embodiments of the present invention of a new and useful "Printed Circuit Board Connector with Integrated EMI Noise Suppression," it is not intended that such references be construed as limitations upon the scope of this invention except as set forth in the following claims.

What is claimed is:

1. A connector assembly for suppressing electromagnetic interference (EMI) generated by electronic circuitry on a printed circuit board (PCB), the connector assembly comprising:

a plurality of conductive through-holes forming a hole pattern on the PCB, the conductive trough-holes electrically connected to the electronic circuitry;

a connector having a plurality of terminal pins extending from a connector surface, the plurality of terminal pins configured to form a pin pattern conforming to the hole pattern of the conductive through-holes on the PCB, the terminal pins insertable into the conductive through-holes of the of the PCB to electrically connect the terminal pins to the electronic circuitry, the connector having an outer perimeter; and a tube of magnetic material surrounding the outer perimeter of the connector, the tube having a first end surface configured to abut a PCB surface of the PCB.

2. The connector assembly of claim 1, wherein the connector includes a plurality of conductors attached in electrical communication with the terminal pins.

3. The connector assembly of claim 2, wherein the plurality of conductors are attached to a source of alternating current (AC) power.

4. The connector assembly of claim 2, wherein the plurality of conductors are attached to a direct current (DC) load.

5. The connector assembly of claim 1, wherein the tube of magnetic material is rectangular.

6. The connector assembly of claim 1, wherein the tube of magnetic material includes an inner wall, an outer wall, the first end surface, and a second end surface, the first and second end surfaces defining a tube height.

7. The connector assembly of claim 6, wherein the inner wall engages the outer perimeter of the connector.

8. The connector assembly of claim 6, wherein the inner wall has a first inner surface, a second inner surface, a third inner surface and a fourth inner surface that are configured to engage the outer perimeter of the connector.

9. The connector assembly of claim 1, wherein the connector includes a connector height, and wherein the tube of magnetic material has a tube height less than the connector height.

10. The connector assembly of claim 9, wherein the tube height is less than 50% of the connector height.

11. A connector assembly for suppressing electromagnetic interference (EMI) from electronic circuitry on a printed circuit board (PCB), the connector assembly comprising:
    a plurality of conductive through-holes on the PCB electrically connected to the electronic circuitry;
    a connector having a plurality of terminal pins extending perpendicularly therefrom, the plurality of terminal pins configured to pass through and electrically engage with the plurality of conductive through-holes and to thereby electrically engage with the electronic circuitry on the PCB; and
    a magnetic collar positionable around the connector, the magnetic collar having a first end positioned proximate to the PCB.

12. The connector assembly of claim 11, wherein the magnetic collar is held in frictional engagement with the connector.

13. The connector assembly of claim 11, wherein the magnetic collar includes a generally rectangular passageway extending from the first end to a second end.

14. The connector assembly of claim 11, wherein the PCB further includes a plurality of leg holes, and wherein the magnetic collar includes a plurality of collar legs extending from the first end thereof.

15. The connector assembly of claim 14, wherein the plurality of leg holes of the PCB are configured to receive the plurality of collar legs, and wherein the terminal pins align with the conductive through-holes when the connector is received through the magnetic collar.

16. A method of suppressing electromagnetic interference (EMI) caused by electrical circuitry on a printed circuit board (PCB), the method comprising:
    connecting the electronic circuitry to a plurality of conductive through-holes on the PCB;
    positioning a connector on the PCB, the connector having a plurality of terminal pins positioned through the plurality of conductive through-holes to electronically couple the terminal pins to the electronic circuitry of the PCB; and
    positioning a magnetic collar around the connector to suppress EMI communicated from the electronic circuitry to the terminal pins.

17. The method of claim 16, wherein the connector has a plurality of conductors connected to a source of alternating current (AC) power.

18. The method of claim 16, wherein the connector has a plurality of conductors connected to a direct current (DC) load.

19. The method of claim 16, further comprising the steps of connecting a plurality of conductors from the connector to a DC load;
    producing a DC voltage on the PCB to provide DC current to the DC load, the DC voltage including EMI superimposed thereon; and
    suppressing the EMI with the magnetic collar as the DC voltage passes through the magnetic collar.

20. The method of claim 16, wherein the PCB is positioned inside a light emitting diode (LED) driver housing.

* * * * *